(12) United States Patent
Ortuzar et al.

(10) Patent No.: US 11,078,715 B2
(45) Date of Patent: Aug. 3, 2021

(54) PROFILE FOR WINDOW, DOOR, FACADE AND CLADDING ELEMENTS

(71) Applicant: TECHNOFORM BAUTEC HOLDING GMBH, Lohfelden (DE)

(72) Inventors: Xavier Ortuzar, Lohfelden (DE); Igor Cemalovic, Lohfelden (DE)

(73) Assignee: TECHNOFORM BAUTEC HOLDING GMBH, Lohfelde (DE)

( * ) Notice: Subject to any disclaimer, the term of this patent is extended or adjusted under 35 U.S.C. 154(b) by 0 days.

(21) Appl. No.: 16/617,792

(22) PCT Filed: May 30, 2018

(86) PCT No.: PCT/EP2018/064288
§ 371 (c)(1),
(2) Date: Nov. 27, 2019

(87) PCT Pub. No.: WO2018/220074
PCT Pub. Date: Dec. 6, 2018

(65) Prior Publication Data
US 2020/0102783 A1    Apr. 2, 2020

(30) Foreign Application Priority Data
May 31, 2017    (EP) .................................... 17173836

(51) Int. Cl.
*E06B 3/263* (2006.01)
*B29C 48/12* (2019.01)
(Continued)

(52) U.S. Cl.
CPC .......... *E06B 3/26303* (2013.01); *B29C 48/12* (2019.02); *C23C 14/0641* (2013.01);
(Continued)

(58) Field of Classification Search
CPC .......... E06B 3/16; E06B 3/26303; E06B 3/22; E06B 3/26336; E06B 3/20; E06B 3/26;
(Continued)

(56) References Cited

U.S. PATENT DOCUMENTS 5,117,601 A    6/1992  Habicht
5,945,048 A    8/1999  Ensinger
(Continued)

FOREIGN PATENT DOCUMENTS

DE    3236357 A1    4/1984
DE    3801564 A1    8/1989
(Continued)

OTHER PUBLICATIONS

International Search Report dated Jun. 28, 2018 for parent application No. PCT/EP2018/064288.
(Continued)

*Primary Examiner* — Patrick J Maestri
(74) *Attorney, Agent, or Firm* — J-TEK Law PLLC; Jeffrey D. Tekanic; Scott T. Wakeman

(57) ABSTRACT

A profile for window, door, facade or cladding elements is disclosed, which comprises a profile body (2) made from thermoplastic material and extending in a longitudinal direction (z) with an essentially constant cross-section (x-y) along the longitudinal direction (z) and having at least one outer surface (2a), and a metal containing layer (4) deposited on at least part of the at least one outer surface (2a), wherein the thermoplastic material is polyamide, propylene, wherein the metal containing layer is made of aluminium or aluminium nitride or chromium, wherein the metal containing layer (4) is deposited directly on the profile body (2) using a PVD technology, and wherein the metal containing layer has a thickness in the range from 110 nm to 170 nm.

20 Claims, 7 Drawing Sheets

(51) Int. Cl.
C23C 14/06 (2006.01)
C23C 14/20 (2006.01)
E06B 3/26 (2006.01)
B29K 23/00 (2006.01)
B29K 77/00 (2006.01)
B29K 309/08 (2006.01)
B29L 31/00 (2006.01)
C23C 14/35 (2006.01)

(52) U.S. Cl.
CPC .............. *C23C 14/205* (2013.01); *E06B 3/26* (2013.01); *B29K 2023/12* (2013.01); *B29K 2077/00* (2013.01); *B29K 2309/08* (2013.01); *B29L 2031/005* (2013.01); *C23C 14/35* (2013.01); *E06B 2003/26372* (2013.01); *E06B 2003/26387* (2013.01)

(58) Field of Classification Search
CPC ........... E06B 2003/6638; B29C 48/022; C23C 24/04; B29K 2077/00
See application file for complete search history.

(56) References Cited

U.S. PATENT DOCUMENTS

| 6,582,643 | B1 | 6/2003 | Brunnhofer |
| 6,803,083 | B2 | 10/2004 | Ensinger |
| 7,913,470 | B2 | 3/2011 | Siodla et al. |
| 2008/0086973 | A1 | 4/2008 | Hallenstvet et al. |
| 2010/0018140 | A1 | 1/2010 | Brunnhofer et al. |
| 2010/0119707 | A1 | 5/2010 | Raybould et al. |
| 2013/0129976 | A1 | 5/2013 | Hertter et al. |

FOREIGN PATENT DOCUMENTS

| DE | 4323480 C2 | 11/1996 |
| DE | 10043526 C1 | 6/2002 |
| DE | 102010016926 A1 | 12/2010 |
| DE | 102009052983 A1 | 5/2011 |
| EP | 0638368 A1 | 2/1955 |
| EP | 0638368 B1 | 8/1997 |
| EP | 1596023 A2 | 11/2005 |
| EP | 1596023 B1 | 10/2009 |
| EP | 2559838 A2 | 2/2013 |
| WO | 2006001708 A1 | 1/2006 |

OTHER PUBLICATIONS

C.-J Li, et al: "Effect of Spray Angle on Deposition Characteristics in Cold Spraying", Thermal Spray 2003: Advancing the Science and Applying the Technology; Proceedings of the 2003 International Thermal Spray Conference, May 5-8, 2003, Orlando, Florida, USA; [ITSC 2003], May 8, 2003, pp. 91-96, XP055364315, ISBN: 978-0-87170-785-7.

Lupoi R, et al: "Deposition of metallic coatings on polymer surfaces using cold spray", Surface and Coatings Technology, Elsevier BV, Amsterdam, NL, vol. 205, No. 7, Dec. 25, 2010, pp. 2167-2173, XP027533922, ISSN: 0257-8972.

Peter C. King, et al: "Embedment of copper particles into polymers by cold spray", Surface and Coatings Technology, vol. 216, Feb. 1, 2013, pp. 60-67, XP055530781, Amsterdam, NL, ISSN: 0257-8972.

Written Opinion of the International Searching Authority dated Jun. 28, 2018 for parent application No. PCT/P2018/064288.

International Preliminary Report on Patentability dated Aug. 2, 2019 for parent application No. PCT/EP2018/064288, including Amendments filed under Art. 34 PCT.

PROFILE FOR WINDOW, DOOR, FACADE AND CLADDING ELEMENTS

CROSS-REFERENCE TO RELATED APPLICATIONS

This application is the U.S. National Stage of International Application No. PCT/EP2018/064288 filed on May 30, 2018, which claims priority to European patent application no. 17 173 836.2 filed on May 31, 2017.

TECHNICAL FIELD

Profile for window, door, facade and cladding elements with thermoplastic body and metal containing layer deposited on an outer body surface, method for manufacturing the same, metal plastic composite profile for window, door, facade and cladding elements with the same and window, door, facade or cladding element with the same The present invention relates to a profile for window, door, facade and cladding elements with thermoplastic body and metal containing layer deposited on an outer body surface, a method for manufacturing the same, a metal plastic composite profile for window, door, facade and cladding elements with the same and a window, door, facade or cladding element with the same.

BACKGROUND OF THE INVENTION

Metal plastic composite profiles for window, door, facade and cladding elements are well known in the prior art. One typical type of such a metal plastic composite profile is disclosed in EP 0 638 368 B1 and its FIG. 1 or U.S. Pat. No. 5,117,601 and its FIG. 2 or DE 38 01 564 A1 and its FIG. 1 or DE 32 36 357 A1 disclosing a profile for window, door or facade elements comprising a profile body made of glass fiber reinforced polyamide with a metal cover applied by vapor deposition. Two metal profiles typically made of aluminium are connected by two insulating webs made of plastic material, e.g., glass fibre reinforced polyamide, which are connected to the metal profiles by rolling-in. That means that the two metal profiles are mechanically connected by the insulating webs which, at the same time, act as a thermal break between the two metal profiles. The metal plastic composite profiles to which the present invention relates, do not necessarily comprise two or more metal profiles connected by one or more plastic profiles. It is also possible that one metal profile is connected to one plastic profile having another function as shown in FIG. 10 of EP 2 559 838 A2.

The corresponding plastic profiles can be made of one or plural plastic materials and blends thereof with solid profile bodies as shown in the above cited prior art. The plastic profiles, to which the invention relates, can also be partly or fully made of foamed plastic material as shown in U.S. Pat. No. 6,803,083 B2.

The plastic profiles to which the invention relates may comprise hollow chambers as shown, e.g., in FIG. 3 of U.S. Pat. No. 6,803,083 B2 or in US 2010/0018140 A1. US 2010/0018140 A1 also shows that the plastic profiles, to which the present invention relates, may have one or plural connecting points to one metal profile such as the two rolling-in heads and one lateral side of the plastic profile as shown in its figures.

Another example of corresponding plastic profiles to which the invention relates, is shown in U.S. Pat. No. 7,913,470 B2.

U.S. Pat. Nos. 5,945,048 and 6,582,643 B1 show examples of methods for manufacturing the plastic bodies of plastic profiles to which the invention relates.

EP 0 638 368 B1, EP 2 559 838 A2, U.S. Pat. No. 7,913,470 B2 describe that the plastic profiles and/or the metal plastic profiles to which the invention relates are often powder coated. To improve powder coating characteristics, the plastic profiles are designed to be fully or partly electrically conductive by adding electrically conductive components to the plastic or metal coatings or the like. EP 0 638 368 B1 discloses an electrically conductive coating which may be made of aluminium with a thickness of 1 µm to 30 µm obtained by different spraying methods and deposited before a powder coating step. A powder coating method for plastic parts is disclosed in DE 10 2010 016 926 A1.

The metal coating of structural elements for door, window or similar applications is also known from WO 2006/001708 A1. A copper coating on plastic parts of frames or housings which is applied by PVD with a thickness of 200 nm to an intermediate layer between the plastic body and the metal layer, which intermediate layer is generated by plasma polymerization of an acrylonitrile containing gas or vapour is known from DE 100 43 526 C1.

SUMMARY OF THE INVENTION

It is therefore one non-limiting object of the present teachings to disclose techniques for improving a profile for window, door, facade and cladding elements that has a thermoplastic body and a metal containing layer deposited on at least one surface of the body, a method for manufacturing the same, a metal plastic composite profile for window, door, facade and cladding elements with such a profile and a window, door, facade or cladding element with such a profile.

In one aspect of the present disclosure, a profile for window, door, facade or cladding elements comprises a profile body that is made from thermoplastic material, which comprises polyamide or polypropylene, and extends in a longitudinal direction (z) with an essentially constant cross-section (x-y) along the longitudinal direction (z). Using a physical vapor deposition (PVD) process, a metal containing layer is deposited directly on at least a portion of at least one outer surface of the profile body. Furthermore, the metal containing layer is made of aluminium nitride or chromium or a blend thereof, or a blend of aluminium with aluminium nitride or chromium, and has a thickness in the range from 110 nm to 170 nm.

This object is achieved by a profile according to claim 1 or a method according to claim 11, a metal plastic composite profile according to claim 13 or a window, door, facade or cladding element comprising such a profile according to claim 14 or 15.

The connection between the thermoplastic profile body and the metal containing layer is very good due to the application method by PVD. The degree of improvement also depends on the combination of the thermoplastic material(s) and the metal containing layer material(s), but the mechanical connection in relation to the thickness of the layer is significantly improved in comparison to prior art profiles, especially for a combination of polyamide with glass fibre reinforcement and a deposited metal containing layer of aluminium or aluminium nitride or chromium or a blend thereof.

It is possible to obtain very thin metal containing layers without intermediate layer between the thermoplastic material and the metal containing layer compared to the prior art with better adherence to the plastic material.

BRIEF DESCRIPTION OF THE DRAWINGS

Further features and advantages will follow from the description of embodiments referring to the drawings. The drawings show:

FIGS. 1, 2 and 3 show different embodiments of metal-plastic composite profiles 100. In FIGS. 1 and 2, a first metal profile 10 and a second metal profile 20 are connected by two insulating strips or insulating webs 1.

Figure 1:
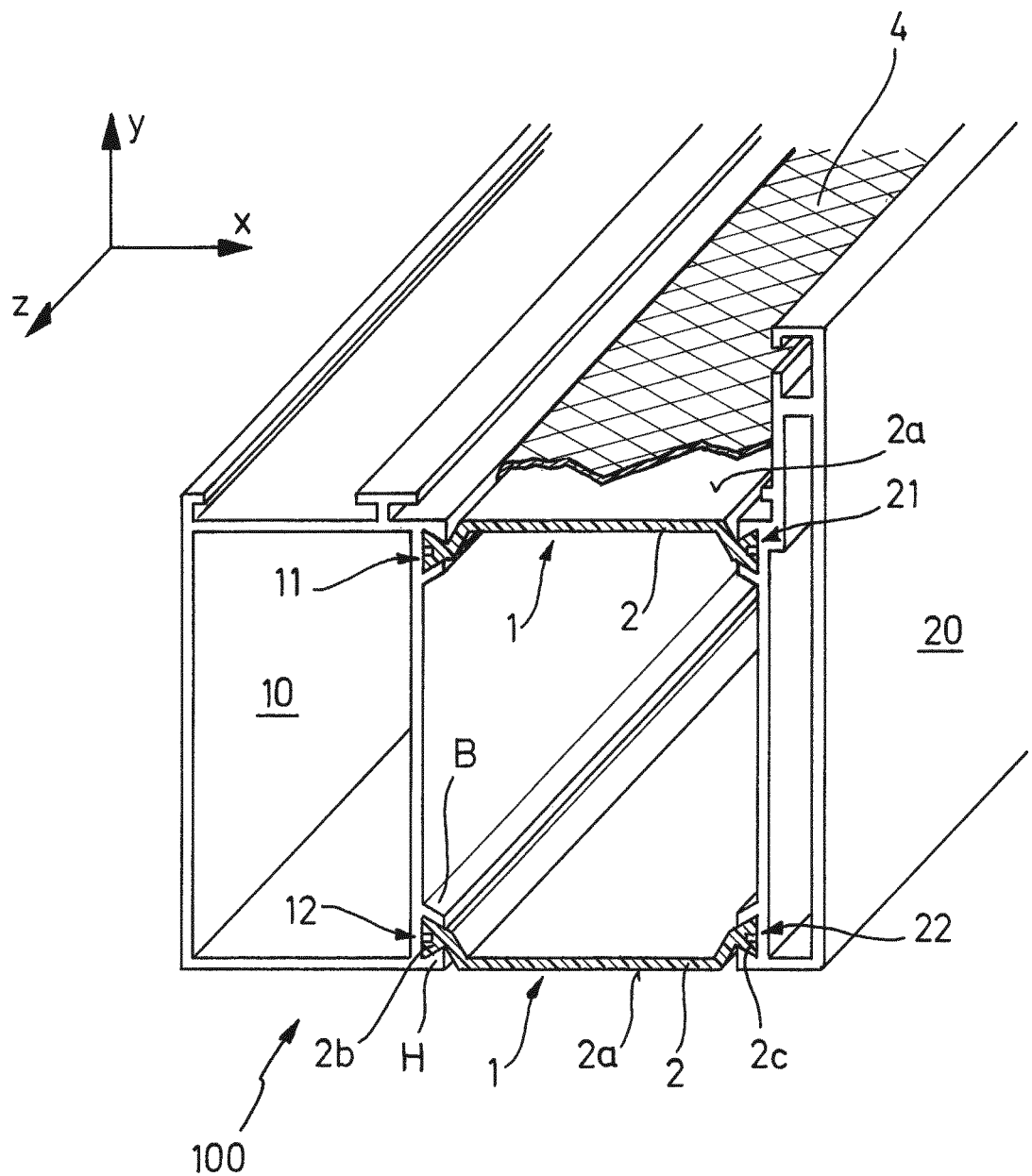
FIG. 1 a perspective view of a metal plastic composite profile according to a first embodiment, wherein the metal containing layer is only partly shown.

The insulating strips (profiles) 1 each comprise a body 2 made of a thermoplastic material. The insulating strips 1 and their profile bodies 2 extend in a longitudinal direction z and have an essentially constant cross-section in the planes x-y perpendicular to the longitudinal direction z. Essentially constant means that interruptions or holes or the same could be present as exemplified in U.S. Pat. No. 7,913,470 B2 but that the cross-sectional shape is, except for such recesses, holes or the like, the same along the longitudinal direction z. The same applies to the metal profiles 10, 20.

The profile bodies 2 of the insulating strips 1 comprise at each of the two edges extending in the longitudinal direction z on the two lateral sides in the lateral direction, one roll-in head 2b, 2c, which has a cross-sectional shape suitable for rolling-in into corresponding grooves 11, 12, 21, 22 of the metal profiles 10, 20. One typical cross-sectional shape of a roll-in head 2b, 2c is a dove-tail shape, but other shapes as known in the art are possible, too. Rolling-in is performed by deforming the hammer H as generally known in the art and exemplarily shown in FIG. 3 of U.S. Pat. No. 7,913,470 B2.

As shown in detail at the insulating strip 1 and its profile body 2 in the upper part of FIG. 1, an outer surface 2a of the profile body 2 is covered with a metal containing layer 4. In FIG. 1, the representation of the metal containing layer 4 is removed in the front part of the outer surface 2a, but this is only for illustrational purposes. In the embodiment, the exposed part of the outer surface 2a is completely covered with the metal containing layer 4.

Figure 2:
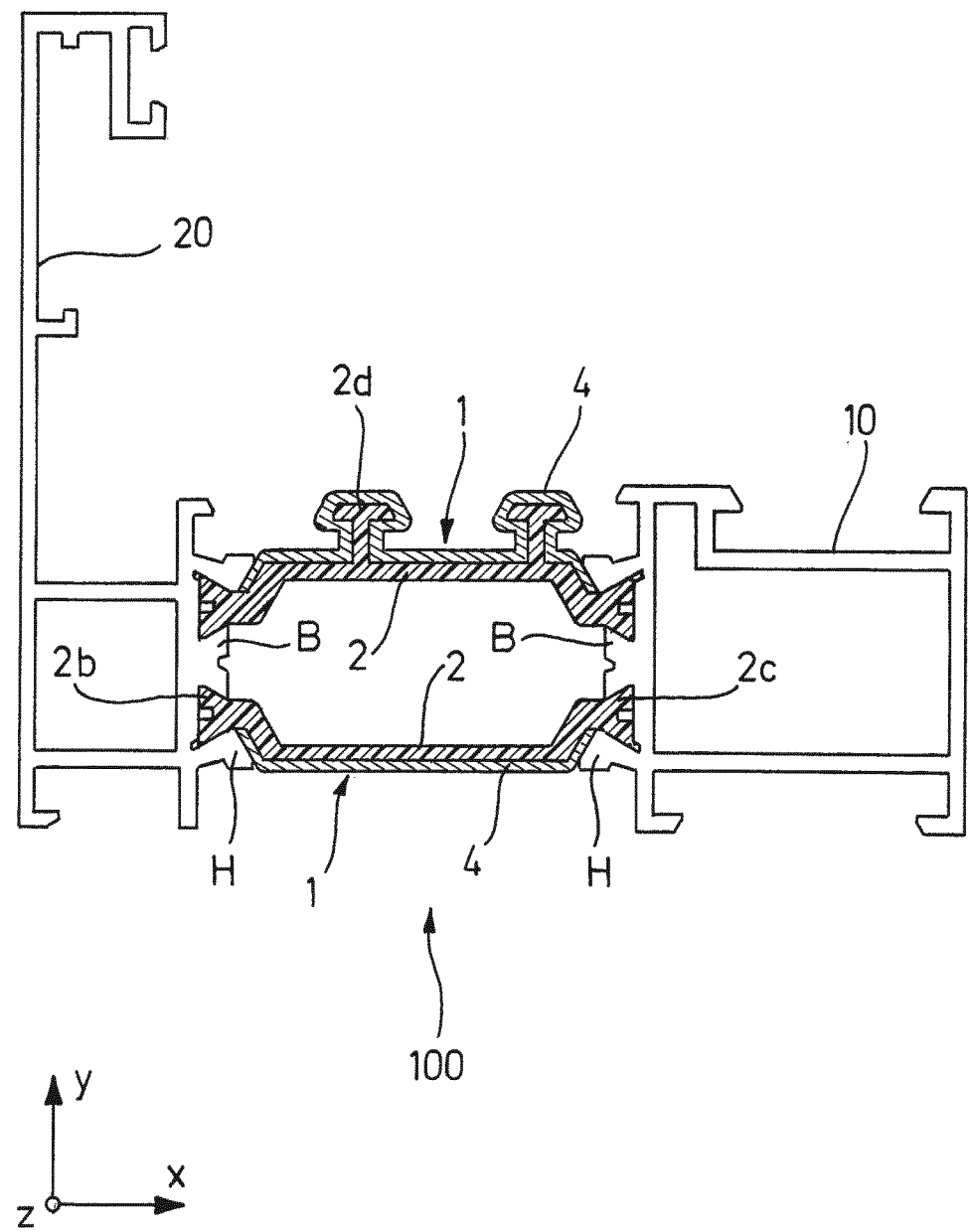
FIG. 2 a cross-sectional view perpendicular to the longitudinal direction z of another embodiment of the metal plastic composite profile with another embodiment of a plastic profile with a metal containing layer.

In FIG. 2, a corresponding configuration is shown and the same reference numerals designate corresponding parts. As can be seen in the cross-section x-y in FIG. 2, the metal containing layer 4 is deposited only on one outer surface 2a of the profile body 2 of the insulating strips 1. In the configuration shown in FIG. 2 (and in FIG. 1), the reason is that this outer surface is exposed to the environment and should be, for example, powder coated.

Figure 3:
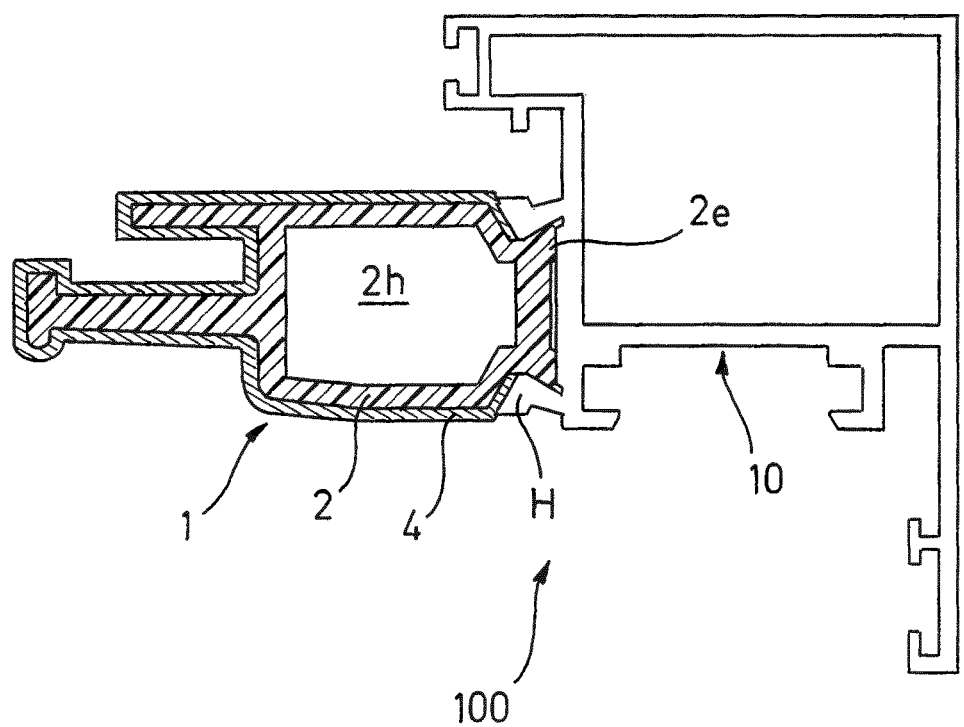
FIG. 3 a cross-sectional view perpendicular to the longitudinal direction z of another embodiment of the metal plastic composite profile with another embodiment of a plastic profile with a metal containing layer.

The embodiment shown in FIG. 3 has only one metal profile 10, to which another embodiment of a plastic profile 1 with a body 2 made from thermoplastic material is connected by rolling-in.

The plastic profile comprises a wider roll-in head 2e and all outer surfaces, which are not rolled-in, are covered with the metal containing layer 4.

DETAILED DESCRIPTION OF THE INVENTION

Many other types of profiles 1 with bodies 2 made of thermoplastic material for use in window, door, facade or cladding element applications can be used with invention, and some other applications will be described in more detail further below. Before describing the same, the characteristics of the profile bodies and the metal containing layers and the corresponding methods of manufacturing are described.

In general, the plastic profile bodies 2 can be manufactured by extrusion as known in the art. Preferred materials for the embodiments are polyamide (PA), polypropylene (PP), polyethylene (PE), polybutylene terephthalate (PBT), acrylonitrile styrene acrylate (ASA) with or without reinforcing materials such as fibres, e.g., glass fibres, carbon fibres, aramide fibres and so on. Especially preferred is PA with a glass fibre content in the range from 10 to 60% especially 25%, in particular PA 66. Other thermoplastic materials than the ones indicated above can be used, but the above are preferred at present.

The metal containing layer is formed by metal materials like aluminium, tin, copper, stainless steel, titanium, molybdenum, nickel, chromium and mixtures of these metal materials and their oxides, potentially mixed with particles formed by non-metallic materials like carbides, nitrides, ceramics, silica and mixtures thereof, including potential addition of fibres and polymers. The preferred material composition is, at present, a layer made of aluminium or aluminium nitride or chromium or a blend thereof in combination with PA 66 with glass fibre reinforcement.

The metal containing layer 4 is formed by Physical Vapour Deposition (PVD) on the, e.g., extruded, body 2 of thermoplastic material.

Physical Vapour Deposition (PVD) describes a number of processes under vacuum (very low pressure of $10^{-1}$ mbar or less) conditions which can be used to deposit thin films and coatings. PVD is characterized by a process in which the coating material (that can be organic or inorganic) goes from a condensed phase to a vapour phase and then back to a thin film condensed phase over the substrate material. One common PVD method is sputtering.

The thickness of the deposited layer(s) over the substrate can vary from 3 nanometers (nm) to 500 nanometers. Common coating materials are titanium (Ti), silver (Ag), gold (Au), aluminum (Al), stainless steel, Copper (Cu), zinc (Zn), tin (Sn), chromium (Cr), rare metals like Lantanium (La) and oxides/nitrides of the same or other metals like titanium nitride, zirconium nitride, chromium nitride, titanium aluminium nitride.

For the present teaching, magnetron sputtering is the preferred PVD method.

The temperature range is set from 293K to 473K.

The metal containing layers are made of aluminum, chromium, aluminum nitride.

The thicknesses of the metal containing layers are from 110 nanometers to 170 nanometers.

The magnetron power can be set from 100 $W/m^2$ to 2500 $W/m^2$

Depending on the process control, the continuity (coverage of the surface of the profile body) can be set from almost non-continuous to completely continuous. Preferred is a complete continuity.

Figure 4:
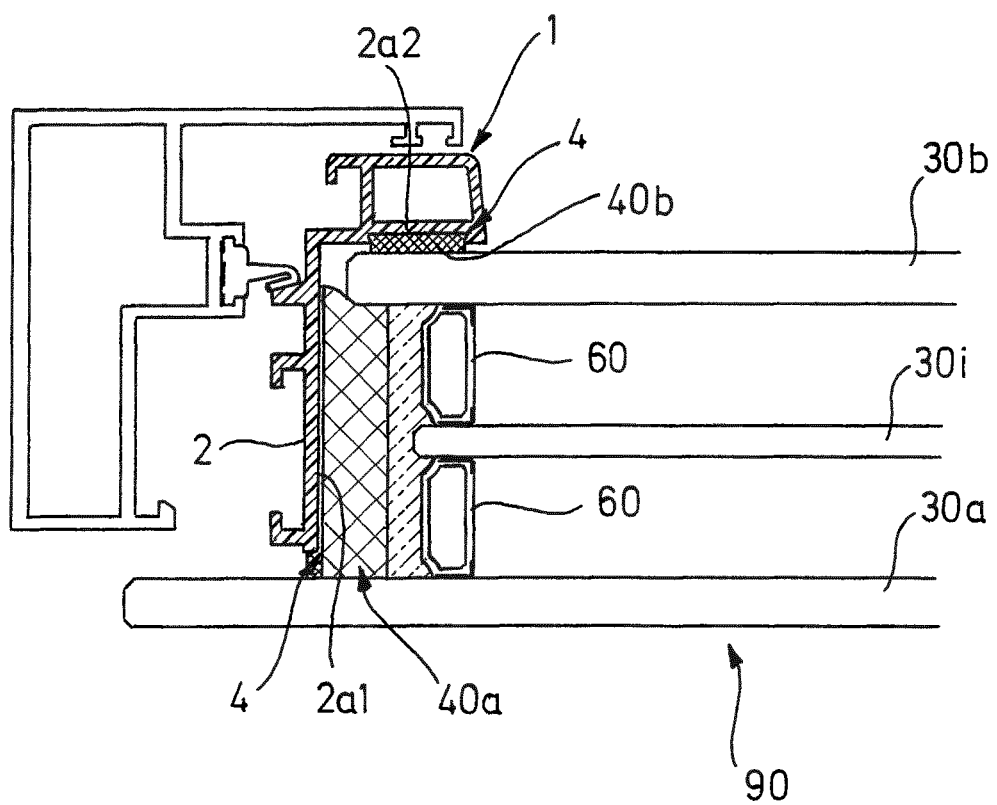
FIG. 4 an embodiment of a window, door, facade or cladding element with an insulating glass unit and a plastic profile according to another embodiment connected thereto.

FIG. 4 shows another embodiment of a window, door, facade or cladding element with a profile body of thermoplastic material with a metal containing layer thereon. In detail, a triple glazing insulating glass unit (IGU) 90 comprises three glass panes 30a, 30b and 30i separated by spacers 60 which are connected to the glass panes by primary and secondary sealants as known in the art. The IGU 90 is a stepped IGU, meaning that one of the outer glass panes 30a protrudes in the cross-section in comparison to the other outer glass pane 30b. At the edge of the IGU 90, the thermal break profile 1 comprising a profile body 2 made of a thermoplastic material is attached. Two portions 2a1 and 2a2 of the outer surface 2a of the profile body 2 comprise a metal containing layer 4 deposited thereon as described before. The metal containing layer 4 on the surface portion 2a1 allows to connect the profile body 2 to a glazing sealing 40a, which may be a weather sealing or a structural sealing, by adhesive in a safe manner. As well known in the art, it is difficult to connect thermoplastic materials to glass or to glazing sealings or to a metal profile by adhesive in a long-term stable manner. This disadvantage can be overcome by the metal containing layer, which is strongly connected to the profile body 2 as described before.

The same essentially applies to the connection of the profile body 2 with a structural sealing 40b at the outside of glass pane 30b. Again, a long-term stable connection through adhesive between the metal containing layer 4 deposited on the outer surface portion 2a2 and the sealing 40b is made possible.

Figure 5:
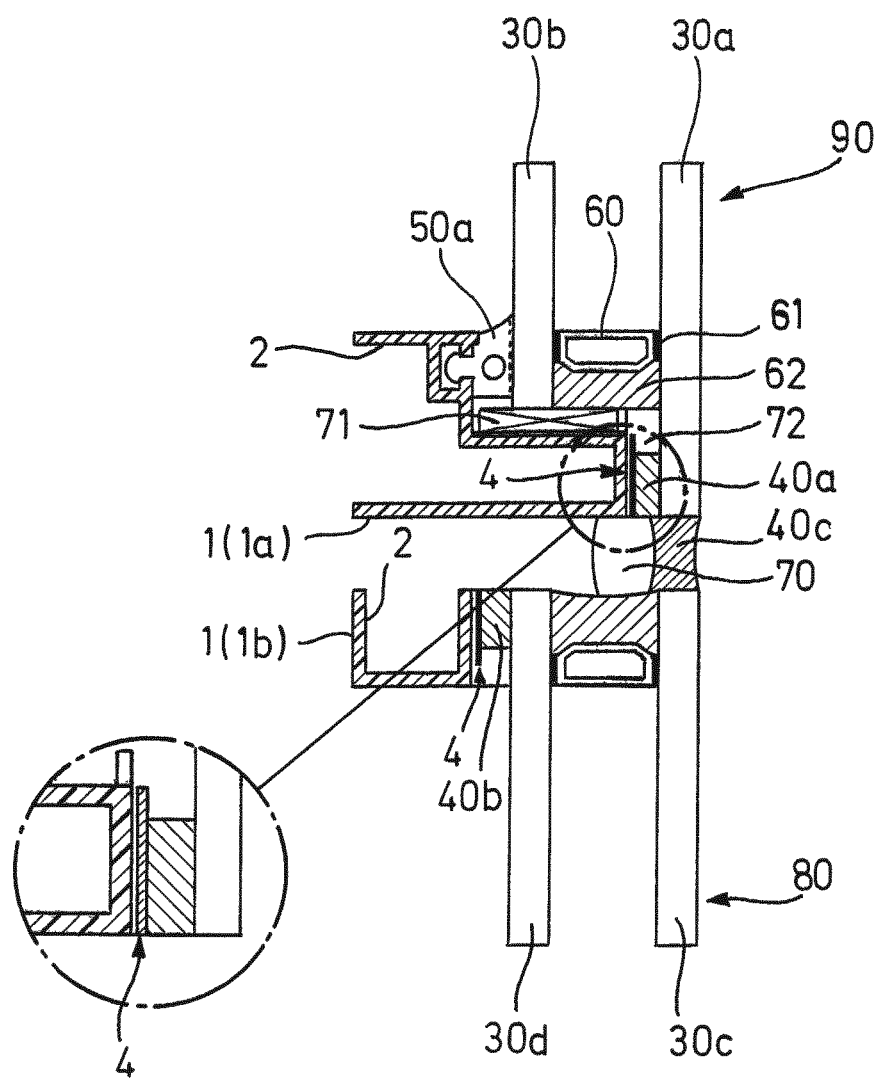
FIG. 5 a cross-sectional view of a connecting area of a structural glazing element as one embodiment of a window, door, facade or cladding element with other embodiments of plastic profiles with metal containing layers.

FIG. 5 shows a cross-section of a portion of a typical structural glazing detail, to which the present invention has been applied. A first double-glazing IGU 90 of the stepped type comprises two glass panes 30a and 30b, which are separated by a spacer 60 and connected via a primary sealant 61 and secondary sealant 62 to form the IGU 90. In the lower part of FIG. 5, a second double-glazing IGU 80 of the non-stepped conventional type is shown, which comprises two glass panes 30c and 30d again separated by a spacer and connected via primary and secondary sealant in the same way.

Stepped IGU 90 is connected to a first thermal break profile 1 (1a) at several portions. At one portion of the outer surface 2a of the profile body 2, a metal containing layer 4 is applied, which faces the inner side of the protruding glass pane 30a. The protruding glass pane 30a is connected to this portion of the profile body 2 carrying the metal containing layer 4 via a structural silicone sealing 40a and adhesive in the same way as described before with respect to FIG. 4. In addition, next to the sealing 40a, the double-sided adhesive foam tape is attached to the protruding glass pane 30a and to a part of the metal containing layer 4. A silicone setting block 71 is positioned between another portion of the profile body 2 and the IGU 90, while a gasket 50a made of silicone is connected to the profile body 2 and abuts the glass pane 30b.

The second IGU 80 is connected to a second profile 1 (1b) having a thermoplastic profile body 2, which, in the cross-section, is essentially U-shaped. On one outer side of a leg of the U-shape, a metal containing layer 4 is deposited in the described manner. This enables to connect the profile body 2 in a long-term stable manner via adhesive to another structural silicone sealing 40b, as shown in FIG. 5.

It becomes clear from FIGS. 4 and 5, that the depositing of the metal containing layer 4 on the profile body 2 of thermoplastic material is not only useful to allow powder coating or the like in metal plastic composite profiles for window, door, facade and cladding elements but also to fulfil the long-felt need to enable long-term stable adhesive connections between IGUs and profile bodies made from thermoplastic material. The two IGUs are connected and the interspace is sealed by another sealing 40c, to which a closed cell polyethylene backer material is attached.

Of course, although not shown, the polyethylene backer material could also be provided with a metal containing layer 4 manufactured as described before.

Figure 6:
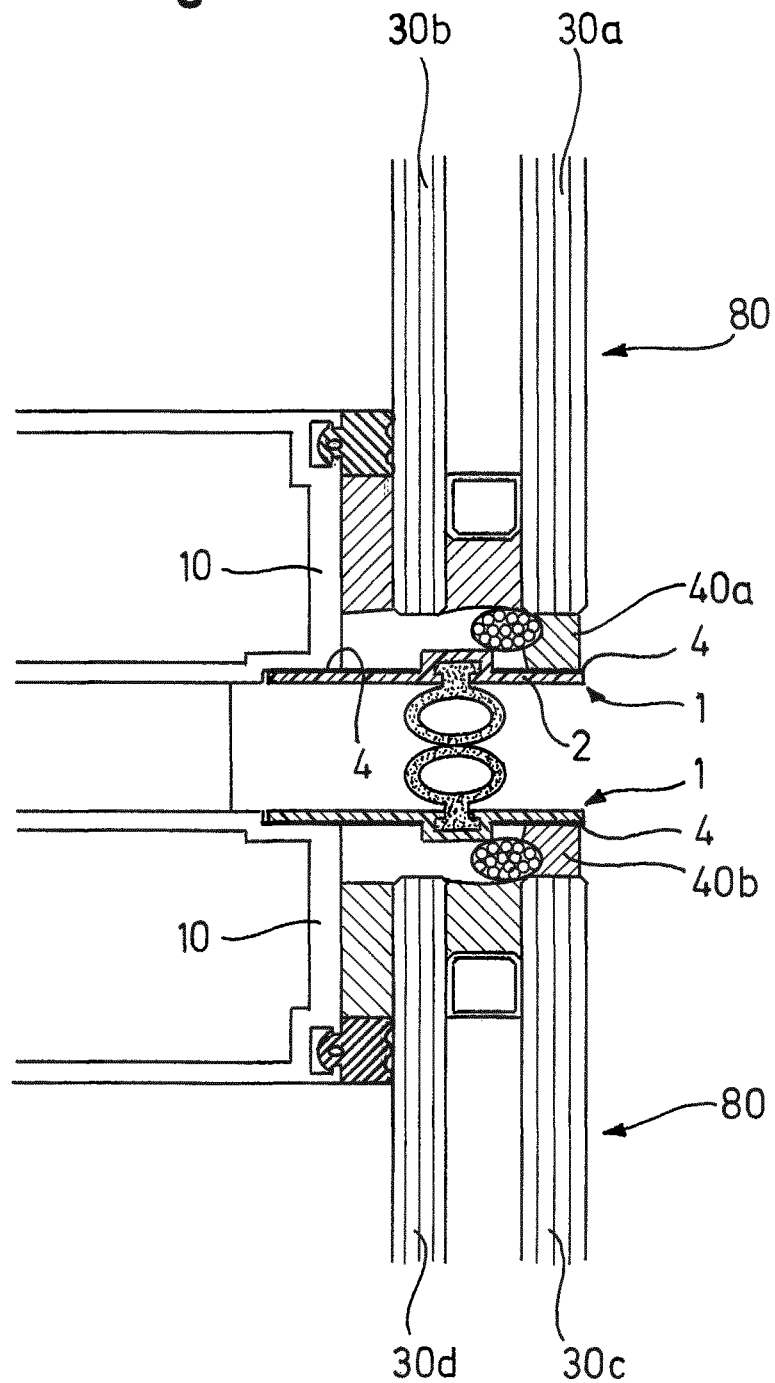
FIG. 6 a cross-sectional view of another embodiment of a metal-plastic composite profile with other embodiments of plastic profiles with a metal containing layer as an example of window, door, facade and cladding elements.

FIG. 6 shows another example of applying the teaching of the present invention to connecting IGUs with profile bodies of thermoplastic material via adhesive. As the construction on the upper and lower side of FIG. 6 is the same, we only describe the upper part in detail. A double-glazing IGU 80 comprises two glass panes 30a, 30b separated by a spacer and connected by primary and secondary sealants. The outer edge of the outer glass pane 30a is provided with a weather sealing 40a. Profile 1 having a profile body 2 of thermoplastic material is provided with a metal containing layer 4 of the described type on its outer surface facing the sealing 40a. This enables again in the described manner a connection by adhesive between the thermoplastic profile body 2 and the sealing 40a which is long-term stable. The profile 1 can also be connected to a metal profile 10 forming part of the building structure by known means, but it is also possible to deposit a metal containing layer 4 on the outer surface 2a of the profile body 2 facing the metal profile 10, again enabling a long-term stable connection by adhesive as an option. The sealing/sealant 40a and 40b can be silicone, polyurethane, acrylate, double sided tape (3M), etc.

Summarizing, a metal containing layer 4 can be deposited on a profile body 2 made of a thermoplastic material as described above. The layer thickness can be from 3 nm to 500 nm, preferably it is in the range from 110 nm to 170 nm. The layer can be deposited with a thickness which is difficult to achieve with other methods and with a mechanical connection strength for such a thin layer which is even more difficult to achieve if not impossible with a previously known method.

The corresponding metal containing layer 4 allows connection by adhesives between thermoplastic profile bodies on one side and glass or metal or a sealing on the other side in a long-term stable manner, which has been difficult to achieve with previous technologies.

A pressure plate design for claddings such as the one disclosed in EP 1 596 023 B1 can be also covered with a metal containing layer according to the present teachings. An application of the present teachings to such pressure plates helps in replacing conventional gaskets with gluing between the pressure plate and the glass or panel unit.

The layer can be different in different coated areas and different in the directions of the x and z axes, e.g., in case of forming an electrical circuit.

The layer can bring different surface roughness, higher for better contact between parts or lower for better sliding between parts which are in contact with the surface of the thermoplastic.

The layer can bring UV and weather protection to the thermoplastic to improve the corrosion resistance to outer climate conditions on buildings, as UV radiation, rain, snow, ice, wind, temperatures of minus twenty degrees Celsius (−20° C.) and up to plus eighty degrees Celsius (+80° C.).

In the embodiment of FIG. 6, the sealing/sealant 40a/40b could be applied to a insulating panel instead of an IGU.

Figure 7:
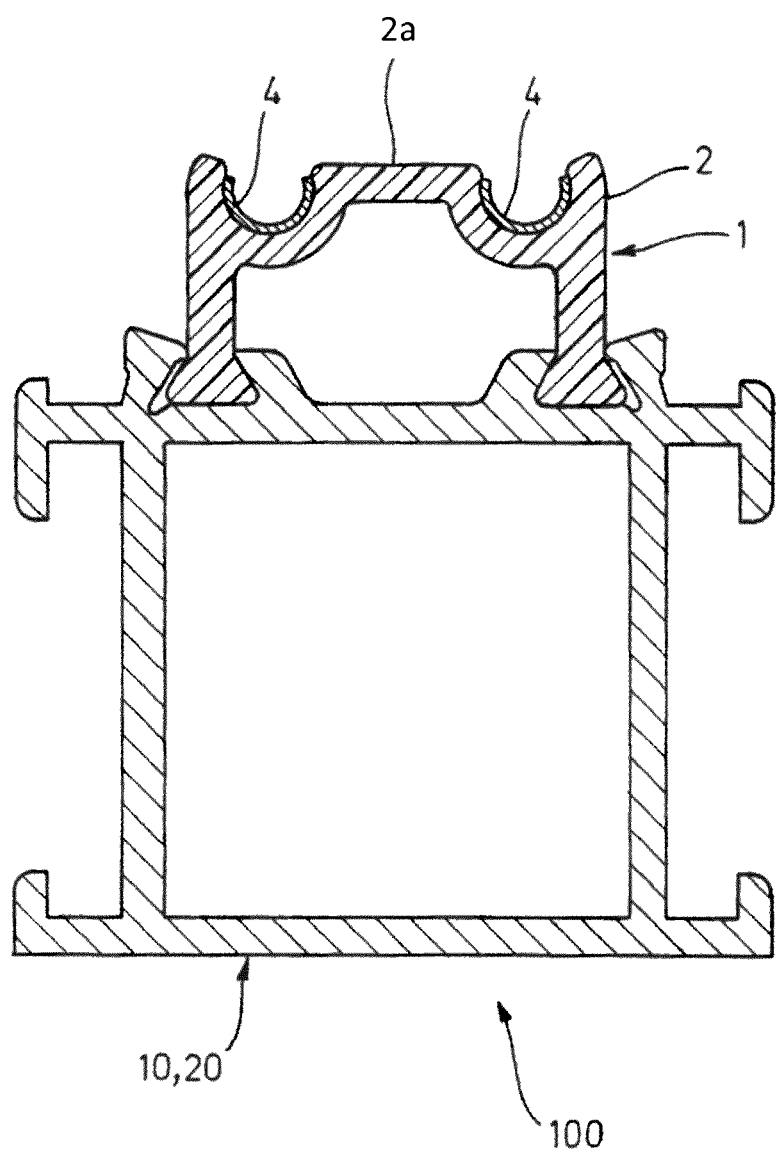
FIG. 7 a cross-sectional view of another embodiment of a metal-plastic composite profile with another embodiment of plastic profiles with a metal containing layer as an example of window, door, facade and cladding elements.

The embodiment of FIG. 7 shows a metal containing layer 4 that allows a connection by adhesives between a thermoplastic profile body 2 connected to a metal profile 10, 20 on one side and hardware for claddings, screws or pins to be attached/connected to the thermoplastic profile body 2 on the other side in a long-term stable manner that has mechanical connection strength values in a range from $1 \times 10^6$ N/m² to $96 \times 10^6$ N/m².

The metal containing layer allows electrostatic coating such as power coating, allows to provide electrical conductivity and/or resistivity to the corresponding profiles, allows to provide electrical circuitry, allows to provide magnetic properties by using corresponding magnetic particles, allows to provide a gas barrier if the layer is made continuous, allows to provide a bacteria and microbiology resistance in high quality, and improves a shear resistance between the metal and thermoplastic parts in thermal breaks for window, door, facade and cladding elements.

It is explicitly stated that all features disclosed in the description and/or the claims are intended to be disclosed separately and independently from each other for the purpose of original disclosure as well as for the purpose of restricting the claimed invention independent of the composition of the features in the embodiments and/or the claims. It is explicitly stated that all value ranges or indications of groups of entities disclose every possible intermediate value or intermediate entity for the purpose of original disclosure as well as for the purpose of restricting the claimed invention, in particular as limits of value ranges.

The invention claimed is:

1. A profile for window, door, facade or cladding elements, comprising:
   a profile body made from thermoplastic material and extending in a longitudinal direction (z) with an essentially constant cross-section (x-y) along the longitudinal direction (z) and having at least one surface, and
   a metal containing layer deposited on at least part of the at least one surface,
   wherein:
   the thermoplastic material is polyamide or polypropylene,
   the metal containing layer is made of aluminium nitride or chromium or a blend thereof,
   the metal containing layer is deposited directly on the profile body using a PVD technology, and
   the metal containing layer has a thickness in the range from 110 nm to 170 nm.

2. The profile according to claim 1, wherein the metal containing layer is deposited directly on the profile body using magnetron sputtering.

3. The profile according to claim 1, wherein the thermoplastic material is polyamide with glass fibre reinforcement.

4. The profile according to claim 1, wherein the thermoplastic material is polyamide 66 containing 10 to 60% glass fibre reinforcement.

5. The profile according to claim 1, wherein the metal containing layer is made of aluminium nitride.

6. The profile according to claim 1, wherein the metal containing layer is made of chromium.

7. The profile according to claim 1, wherein the profile body is made fully or partly from foamed thermoplastic material.

8. The profile according to claim 7, wherein the foamed thermoplastic material has a density of foam cells of less than 10 volume % or no foam cells in a layer of a thickness of 0.1 mm at the at least one outer surface.

9. The profile according to claim 1, wherein a powder coating layer is formed on the metal containing layer.

10. A method for manufacturing a profile for window, door, facade or cladding elements comprising a profile body (2) made from thermoplastic material and extending in a longitudinal direction (z) with an essentially constant cross-section (z-y) along the longitudinal direction (z) and having at least one outer surface (2a), and a metal containing layer (4) deposited on at least part of the at least one outer surface (2a), comprising:
    extruding the profile body from polyamide or polypropylene, and
    depositing a metal containing layer made of aluminium nitride or chromium or a blend thereof by PVD on the at least one surface (2a) of the profile body (2) with a thickness in the range from 110 nm to 170 nm.

11. The method according to claim 10, wherein the thermoplastic material is polyamide 66 containing 20 to 30% glass fibre reinforcement.

12. A metal plastic composite profile for window, door, facade or cladding elements, comprising at least one metal profile and at least one profile according to claim 1 connected thereto.

13. A window, door, facade or cladding element comprising:
    a glass pane,
    a sealing element, and
    at least one profile according to claim 1,
    wherein the glass pane is connected to the at least one outer surface of the profile via the sealing element and an adhesive is disposed between the sealing element and the metal containing layer.

14. A window, door, facade or cladding element comprising:
    the profile according to claim 1,
    wherein the metal containing layer forms electrical circuitry.

15. A profile for window, door, facade or cladding elements, comprising:
    a profile body made from thermoplastic material and extending in a longitudinal direction (z) with an essentially constant cross-section (x-y) along the longitudinal direction (z) and having at least one surface, and
    a metal containing layer deposited on at least part of the at least one surface,
    wherein:
    the thermoplastic material is polyamide or polypropylene,
    the metal containing layer is made of a blend of aluminium with aluminium nitride and/or chromium,
    the metal containing layer is deposited directly on the profile body using a PVD technology, and
    the metal containing layer has a thickness in the range from 110 nm to 170 nm.

16. The profile according to claim 15, wherein the metal containing layer is deposited directly on the profile body using magnetron sputtering.

17. The profile according to claim 15, wherein the thermoplastic material is polyamide with glass fibre reinforcement.

18. The profile according to claim 15, wherein the thermoplastic material is polyamide 66 containing 10 to 60% glass fibre reinforcement.

19. The profile according to claim 15, wherein the profile body is made fully or partly from foamed thermoplastic material.

20. The profile according to claim 19, wherein the foamed thermoplastic material has a density of foam cells of less than 10 volume % or no foam cells in a layer of a thickness of 0.1 mm at the at least one outer surface.

* * * * *

UNITED STATES PATENT AND TRADEMARK OFFICE
CERTIFICATE OF CORRECTION

| | |
|---|---|
| PATENT NO. | : 11,078,715 B2 |
| APPLICATION NO. | : 16/617792 |
| DATED | : August 3, 2021 |
| INVENTOR(S) | : Ortuzar et al. |

Page 1 of 1

It is certified that error appears in the above-identified patent and that said Letters Patent is hereby corrected as shown below:

On the Title Page

Item (73), the Assignee's city name should be changed from "Lohfelde" to ---Lohfelden---.

Signed and Sealed this
Ninth Day of August, 2022

Katherine Kelly Vidal
*Director of the United States Patent and Trademark Office*